(12) United States Patent
Ayzenberg et al.

(10) Patent No.: US 10,374,355 B2
(45) Date of Patent: Aug. 6, 2019

(54) ASYMMETRIC LATCHES FOR PLUGGABLE TRANSCEIVERS

(71) Applicant: Amphenol Corporation, Wallingford, CT (US)

(72) Inventors: Mark M. Ayzenberg, Hudson, NH (US); Jason Si, Toronto (CA)

(73) Assignee: Amphenol Corporation, Wallingford, CT (US)

(*) Notice: Subject to any disclaimer, the term of this patent is extended or adjusted under 35 U.S.C. 154(b) by 0 days.

(21) Appl. No.: 16/021,944

(22) Filed: Jun. 28, 2018

(65) Prior Publication Data

US 2019/0013617 A1     Jan. 10, 2019

Related U.S. Application Data

(60) Provisional application No. 62/529,607, filed on Jul. 7, 2017.

(51) Int. Cl.
| | |
|---|---|
| *H01R 13/62* | (2006.01) |
| *H01R 13/627* | (2006.01) |
| *H01R 13/6594* | (2011.01) |
| *G02B 6/42* | (2006.01) |
| *H05K 9/00* | (2006.01) |
| *H01R 13/6582* | (2011.01) |

(52) U.S. Cl.
CPC ....... *H01R 13/6275* (2013.01); *G02B 6/4261* (2013.01); *H01R 13/6582* (2013.01); *H01R 13/6594* (2013.01); *H05K 9/0058* (2013.01)

(58) Field of Classification Search
CPC ............ H01R 13/6658; H01R 13/6275; H01R 13/6335
See application file for complete search history.

(56) References Cited

U.S. PATENT DOCUMENTS

| | | |
|---|---|---|
| 5,037,330 A | 8/1991 | Fulponi et al. |
| 5,066,236 A | 11/1991 | Broeksteeg |
| 5,280,191 A | 1/1994 | Chang |

(Continued)

OTHER PUBLICATIONS

International Search Report and Written Opinion for International Application No. PCT/US2018/039919 dated Nov. 8, 2018.

*Primary Examiner* — Ross N Gushi
(74) *Attorney, Agent, or Firm* — Wolf, Greenfield & Sacks, P.C.

(57) ABSTRACT

An interconnection system including a pluggable transceiver and a connector disposed in a cavity of a conductive cage. The pluggable transceiver may include a latching mechanism for locking to the conductive cage. The latching mechanism may include a pair of latches positioned on opposite sides of the pluggable transceiver. The latches may be spatially offset from each other along a longitudinal and/or vertical direction. Corresponding latching tabs in the conductive cage may be disposed in the same relationship, even in a ganged configuration when latching tabs for adjacent cavities are formed in a common wall between cavities. Cammed surfaces of a release mechanism, centered between latching edges of the transceiver latches may impart a latch releasing force at a central portion of the latching tab forcing the lathing tab back into the common wall, reducing rotational moment applied in prior designs, such as QSFP ganged cages.

25 Claims, 16 Drawing Sheets

(56) References Cited

U.S. PATENT DOCUMENTS

| | | |
|---|---|---|
| 5,332,397 A | 7/1994 | Ingalsbe |
| 5,637,015 A | 6/1997 | Tan et al. |
| 5,797,770 A | 8/1998 | Davis et al. |
| 5,808,236 A | 9/1998 | Brezina et al. |
| 5,865,646 A | 2/1999 | Ortega et al. |
| 5,924,890 A | 7/1999 | Morin et al. |
| 6,022,239 A | 2/2000 | Wright |
| 6,215,666 B1 | 4/2001 | Hileman et al. |
| 6,238,241 B1 | 5/2001 | Zhu et al. |
| 6,283,786 B1 | 9/2001 | Margulis et al. |
| 6,517,382 B2 | 2/2003 | Flickinger et al. |
| 6,776,649 B2 | 8/2004 | Pape et al. |
| 6,816,376 B2 | 11/2004 | Bright et al. |
| 7,070,446 B2 | 7/2006 | Henry et al. |
| 7,175,444 B2 | 2/2007 | Lang et al. |
| 7,198,519 B2 | 4/2007 | Regnier et al. |
| 7,303,438 B2 | 12/2007 | Dawiedczyk et al. |
| 7,422,483 B2 | 9/2008 | Avery et al. |
| 7,448,897 B2 | 11/2008 | Dawiedczyk et al. |
| 7,575,471 B2 | 8/2009 | Long |
| 7,585,188 B2 | 9/2009 | Regnier |
| 7,781,294 B2 | 8/2010 | Mauder et al. |
| 7,806,698 B2 | 10/2010 | Regnier |
| 7,871,294 B2 | 1/2011 | Long |
| RE43,427 E | 5/2012 | Dawiedczyk et al. |
| 8,465,320 B2 | 6/2013 | Long |
| 8,469,738 B2 | 6/2013 | Long |
| 8,475,210 B2 * | 7/2013 | Wang ................ H01R 13/6658 439/607.31 |
| 8,597,045 B2 * | 12/2013 | Zhu .................... H01R 13/506 439/357 |
| 8,740,644 B2 | 6/2014 | Long |
| 9,118,151 B2 | 8/2015 | Tran et al. |
| 9,210,817 B2 * | 12/2015 | Briant ................ H05K 5/0013 |
| 9,246,262 B2 * | 1/2016 | Brown .................. H01R 13/62 |
| 9,246,280 B2 * | 1/2016 | Neer .................... G02B 6/4246 |
| 9,276,358 B2 * | 3/2016 | Ista ....................... G02B 6/42 |
| 9,671,582 B2 * | 6/2017 | Yeh ....................... H04B 10/40 |
| 9,711,901 B2 * | 7/2017 | Scholeno ............ H01R 12/712 |
| 9,829,662 B2 * | 11/2017 | Kurashima .......... G02B 6/3887 |
| 9,929,500 B1 * | 3/2018 | Ista ...................... G02B 6/4261 |
| 10,020,614 B1 * | 7/2018 | Bucher ............. H01R 13/6275 |
| 10,109,968 B2 * | 10/2018 | Khazen ................. H01R 31/06 |
| 10,128,627 B1 * | 11/2018 | Kazav ................. G02B 6/4246 |
| 2002/0197043 A1 | 12/2002 | Hwang |
| 2010/0018738 A1 | 1/2010 | Chen et al. |
| 2010/0078738 A1 | 4/2010 | Chambers et al. |
| 2011/0081114 A1 * | 4/2011 | Togami ................ G02B 6/4246 385/76 |
| 2012/0052712 A1 * | 3/2012 | Wang ................ H01R 13/6275 439/352 |
| 2012/0058665 A1 * | 3/2012 | Zerebilov .......... H01R 13/6275 439/370 |
| 2012/0164860 A1 * | 6/2012 | Wang .................. G02B 6/4261 439/159 |
| 2014/0035755 A1 * | 2/2014 | Ward ...................... G08B 5/00 340/691.1 |
| 2014/0193993 A1 * | 7/2014 | Meng ................... H01R 13/633 439/352 |
| 2015/0093083 A1 * | 4/2015 | Tsai ...................... G02B 6/423 385/92 |
| 2016/0004022 A1 * | 1/2016 | Ishii ..................... G02B 6/4261 385/92 |
| 2016/0054527 A1 | 2/2016 | Tang et al. |
| 2016/0131859 A1 | 5/2016 | Ishii et al. |
| 2018/0089966 A1 * | 3/2018 | Ward ...................... G08B 5/00 |
| 2018/0212385 A1 * | 7/2018 | Little .................. H01R 13/504 |
| 2018/0278000 A1 * | 9/2018 | Regnier ............. H01R 12/721 |
| 2018/0287280 A1 * | 10/2018 | Ratkovic ............ H01R 12/596 |

* cited by examiner

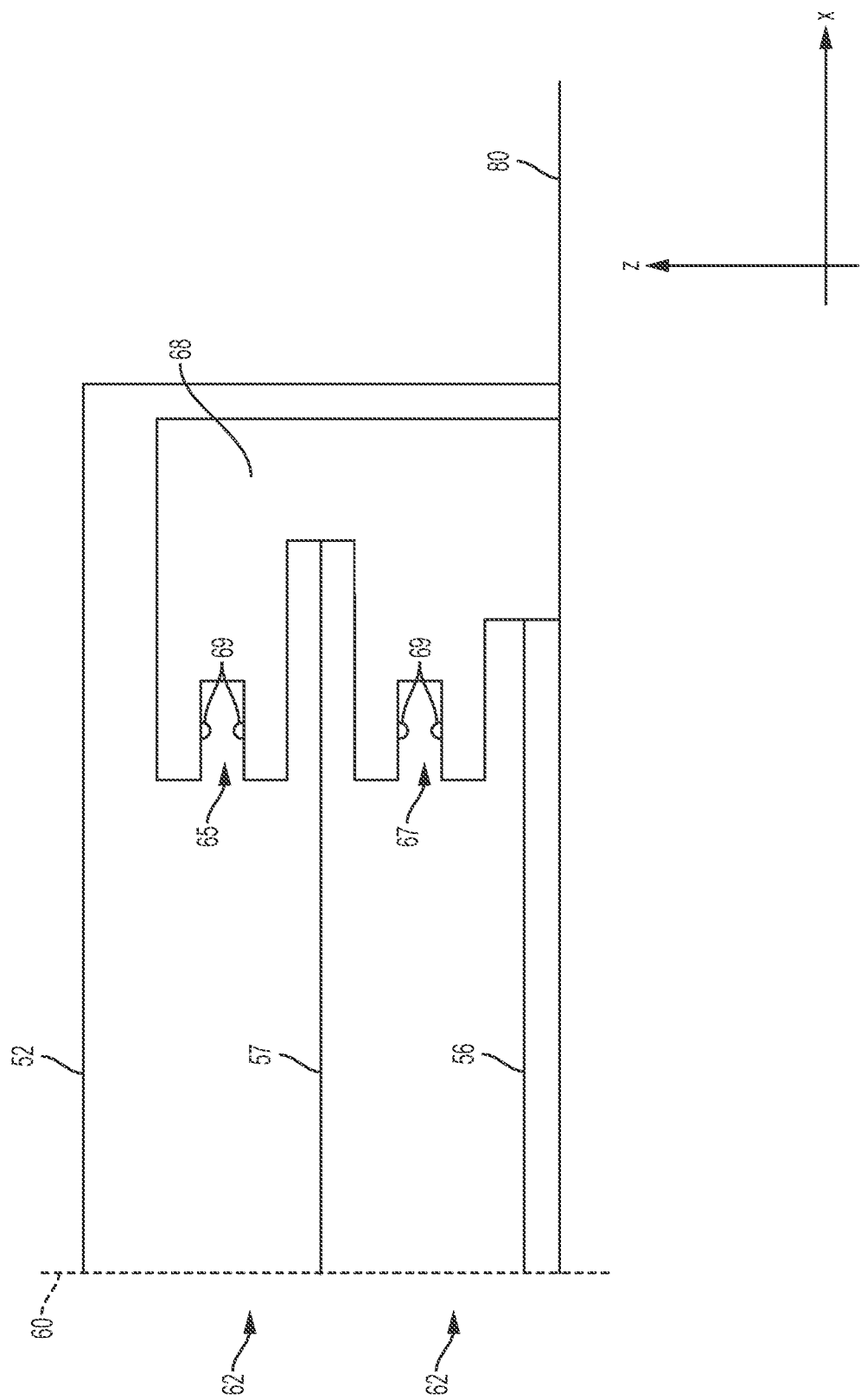

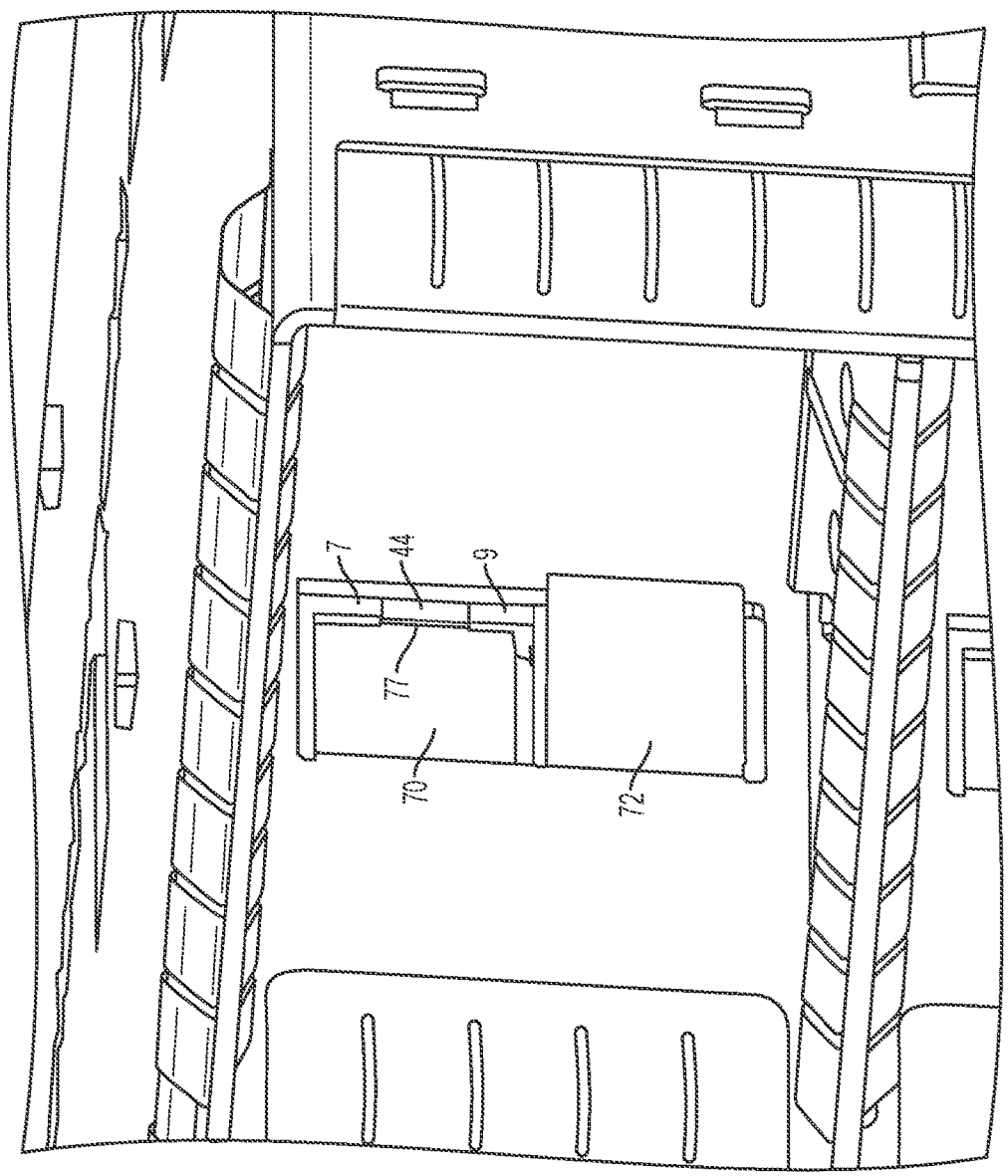

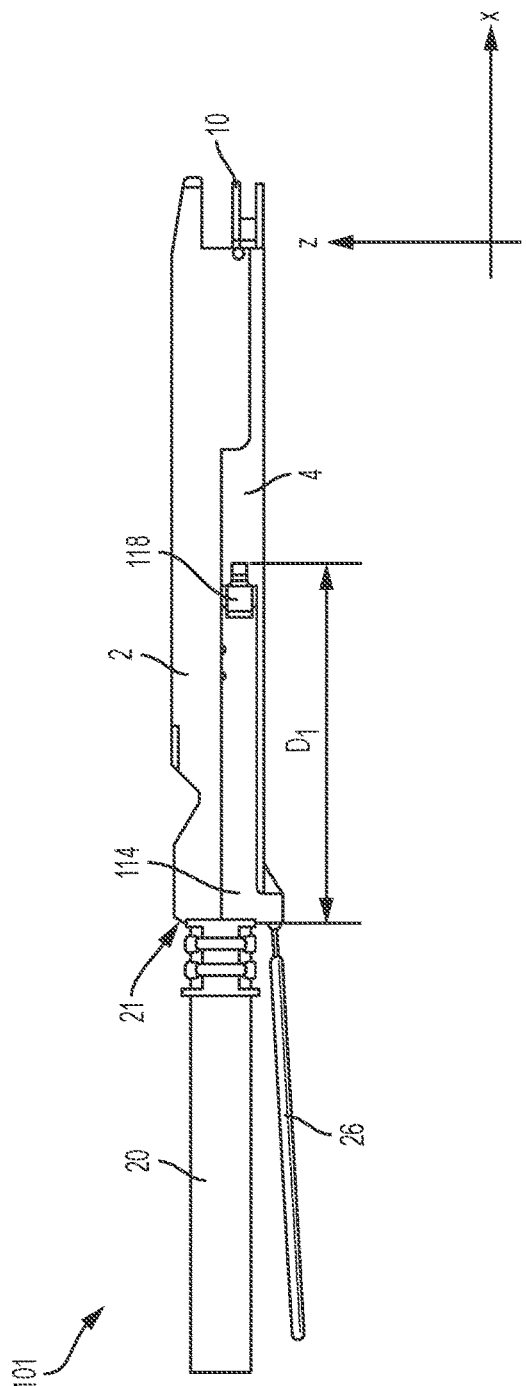
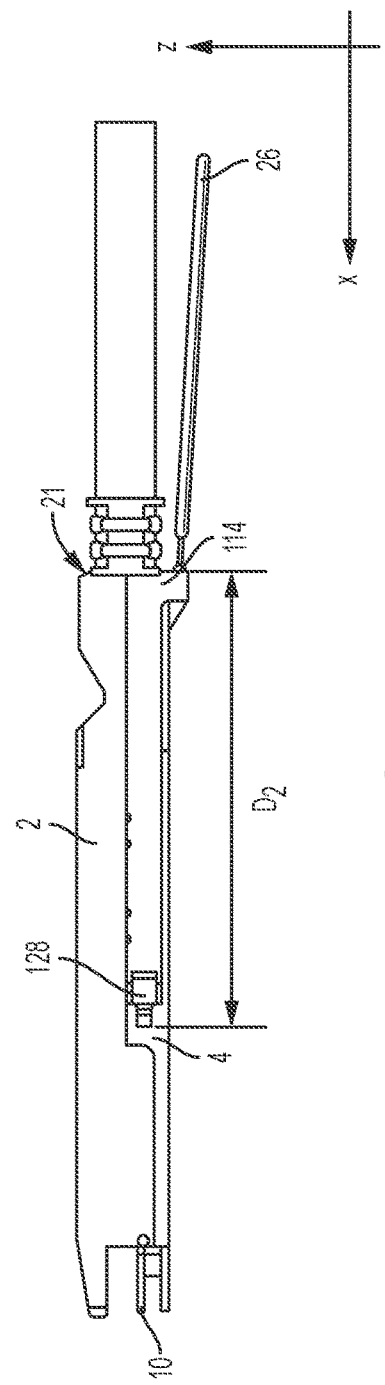
FIG. 5A
FIG. 5B

ASYMMETRIC LATCHES FOR PLUGGABLE TRANSCEIVERS

CROSS REFERENCE TO RELATED APPLICATIONS

This patent application claims priority to and the benefit of U.S. Provisional Patent Application Ser. No. 62/529,607, filed on Jul. 7, 2017 and entitled "ASYMMETRIC LATCHES FOR PLUGGABLE TRANSCEIVERS," which is incorporated herein by reference in its entirety.

BACKGROUND

This patent application relates generally to pluggable transceivers for transmitting and receiving signals between electronic devices, such as servers and routers.

Pluggable transceivers are often used in telecommunications and data communications to enable signals to be transmitted between electronic devices. One end of a transceiver may have a mating interface designed to mate to a connector inside an electronic device. The other end of the transceiver may be attached to a cable, which may be routed to another electronic device. For example, pluggable transceivers can be used to connect network devices, such as switches, routers or media converters, via fiber optic or copper networking cables.

Pluggable transceivers include a module connected to a cable and hardware for processing signals disposed inside the module. When used with an optical cable, the cable typically includes one or more optical fibers, such as single-mode or multi-mode fibers. The hardware disposed in the module includes circuitry for converting signals from the electrical domain to the optical domain, for example using lasers, and for converting signals from the optical domain to the electrical domain, for example using photodetectors. When used in electrical communications, the cable typically includes copper wires, and the hardware includes circuitry for modulating and demodulating the signals. In some circumstances, the hardware may further include analog-to-digital converters and digital-to-analog converter. However, in some instances the hardware inside the module may simply provide a connection between the mating interface and the cable so that connections can be made between the electronic device and the cable. Such purely passive components may nonetheless be referred to as a "transceiver" as they support communication between electronic devices in the same way as an optical transceiver or active electrical components, but possibly at lower data rates or over shorter distances.

The mating interface of the pluggable transceiver is plugged into a connector, which is usually mounted on a printed circuit board. The connector may be surrounded by a cage. The cage may be grounded to the printed circuit board, providing electromagnetic shielding around the connector. The cage may have a cavity into which the pluggable module may be inserted to align the pluggable module with the connector. Additionally, the cage may have latching features that cooperate with complimentary latching features on the pluggable module to hold the pluggable module in the cage and in engagement with the connector. To support multiple connections to the same electronic devices, cages may be formed in a ganged configuration, with multiple cavities, each housing a connector for a pluggable transceiver, formed as a unit. In a ganged configuration, a single metal sheet, for example, may form a wall of two adjacent cavities.

Various standards exist that specify form-factors and required performance metrics with which manufacturers of pluggable transceivers must comply. Examples of industry standards include small form-factor pluggable (SFP) transceivers, quad small form-factor pluggable (QSFP) transceivers, and C form-factor pluggable (CFP) transceivers.

SUMMARY

According to one aspect of the present application, a pluggable transceiver configured to be mated to a connector along a first direction is provided. The pluggable transceiver may comprise a housing comprising a back wall having an opening for receiving a cable therein and a bottom wall, a transceiver disposed within the housing, the transceiver comprising a plurality of signal contacts offset from one another along a second direction, and a release slide connected to the housing and comprising first and second release elements, the first and second release elements being spatially offset from one another along the first direction and/or along a third direction perpendicular to the first and second directions.

In some embodiments, first release element is positioned at a first distance, along the first direction, from the back wall, and the second release element is positioned at a second distance, along the first direction, from the back wall, the second distance being different from the first distance.

In some embodiments, the first release element is positioned at a first distance, along the third direction, from the bottom wall, and the second release element is positioned at a second distance, along the third direction, from the bottom wall, the second distance being different from the first distance.

In some embodiments, the first release element is connected to the latching mechanism through a jog.

In some embodiments, the jog abuts a protrusion formed in the housing.

In some embodiments, the release slide is configured to slide with respect to the housing when pulled away from the housing.

In some embodiments, the pluggable transceiver further comprises a lanyard coupled to the release slide.

In some embodiments, the pluggable transceiver further comprises a compliant member coupled between the housing and the release slide.

In some embodiments, the transceiver comprises a paddle card, the paddle card having an edge that protrudes from an aperture formed in the housing.

In some embodiments, the transceiver comprises an optical device.

In some embodiments, each of the first and second release elements comprises a cammed surface forming a depression in the housing.

In some embodiments, the cammed surface is a first cammed surface, and wherein each of the first and second release elements comprises a second cammed surface connected to a respective first cammed surface, the second cammed surface pointing away from the housing.

In some embodiments, the first release element fits, at least partially, within a slot formed between a pair of latches.

In some embodiments, wherein the first direction matches with a longitudinal axis of the transceiver, and wherein the plurality of signal contacts and the back wall are at opposite ends of the pluggable transceiver along the longitudinal axis.

According to another aspect of the present application, a conductive cage for a connector is provided. The conductive cage may comprise an upper conductive wall, a lower conductive wall, first and second lateral conductive walls bounding a cavity with the connector therein, the cavity being configured to receive a pluggable transceiver along a first direction, and a first latching tab formed on the first lateral conductive wall and a second latching tab formed on the second lateral conductive wall, wherein the first latching tab and the second latching tab are spatially offset from one another along the first direction.

In some embodiments, the connector is at a first end of the cavity and the cavity comprises an entrance at a second end opposite the first end; the first latching tab is positioned at a first distance, along the first direction, from the entrance to the cavity, and the second latching tab is positioned at a second distance, along the first direction, from the entrance to the cavity, the second distance being different from the first distance.

In some embodiments, the first and second latching tabs protrude into the cavity.

In some embodiments, each of the first and second latching tabs comprises a first end connected to the respective lateral conductive wall and a second, free end.

In some embodiments, the cavity is a first cavity and the pluggable transceiver is a first pluggable transceiver, and the conductive cage further comprises a third lateral conductive wall, such that the second conductive wall, the third conductive wall, the upper conductive wall and the lower conductive wall form a second cavity configured to receive a second pluggable transceiver along the first direction, and a third latching tab formed on the second lateral conductive wall and a fourth latching tab formed on the third lateral conductive wall, wherein the third latching tab and the fourth latching tab are spatially offset from one another along the first direction.

In some embodiments, the first and third latching tabs are aligned along the first direction and the third direction, and the second and fourth latching tabs are aligned along the first direction and the third direction.

In some embodiments, the connector comprises a quad small form-factor pluggable (QSFP) connector.

According to yet another aspect of the present application, a method of connecting a pluggable transceiver with a connector disposed within a conductive cage is provided. The method may comprise inserting, along a first direction, the pluggable transceiver in a cavity formed by an upper conductive wall, a lower conductive wall, first and second lateral conductive walls of the cage, engaging a latching tab formed in the first lateral conductive wall with first and second latches formed in the pluggable transceiver, and electrically connecting a plurality of signal contacts formed in the pluggable transceiver with respective contact ends formed in the connector.

In some embodiments, engaging the latching tab with the first and second latches comprises abutting a first end of the latching tab against the first latch and abutting a second end, opposite the first end, of the latching tab against the second latch.

In some embodiments, the method further comprises disengaging the latching tab from the first and second latches by exercising a force between the first and second ends of the latching tab.

In some embodiments, exercising of the force between the first and second ends of the latching tab is performed by sliding a cammed surface of the pluggable transceiver against a portion of the latching tab positioned between the first and second ends.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 2B is a side view illustrating a connector disposed within a cage, in accordance with some embodiments;

FIG. 4 is an isometric view illustrating latching tabs for two adjacent cavities, in accordance with some embodiments;

FIG. 5A is a side view illustrating a first side of another pluggable transceiver, in accordance with some embodiments;

FIG. 5B is a side view illustrating a second side of the pluggable transceiver of FIG. 5A in accordance with some embodiments;

DETAILED DESCRIPTION

Figure 1B:
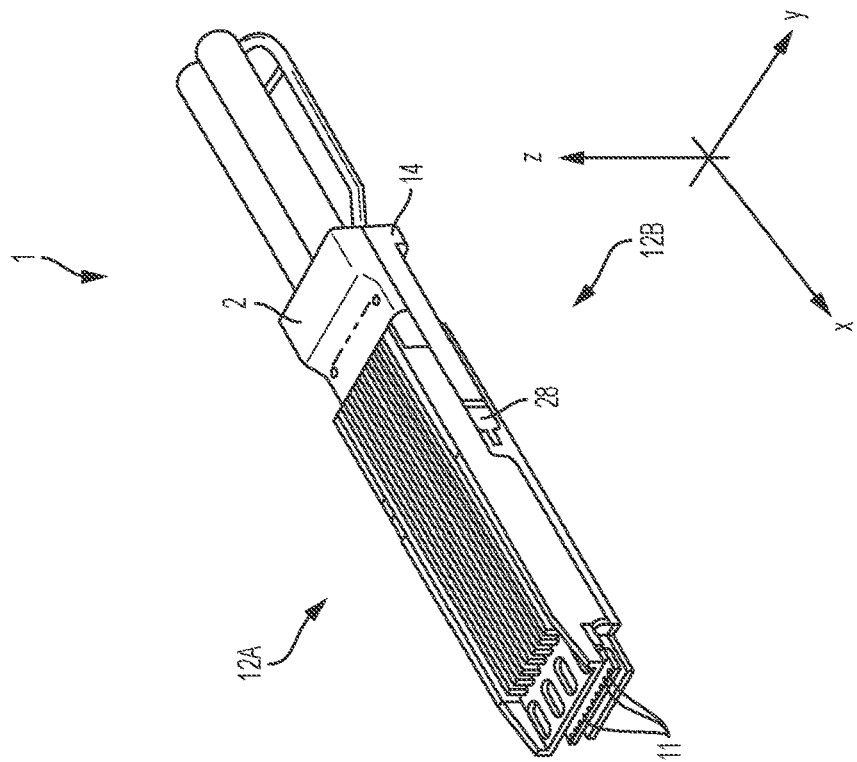
FIG. 1B is an isometric view illustrating a second side of the pluggable transceiver of FIG. 1A, in accordance with some embodiments.

The inventors have recognized and appreciated that conventional mechanisms for latching a pluggable transceiver with a receiving cage are susceptible to faults and damage, which may lead to reductions in the lifetime of such latching mechanisms. Conventional latching mechanisms include latching tabs extending from the sidewalls of a cage into receiving cavities. When a pluggable transceiver is inserted all the way into the cavity, one or more latching tabs engage with complimentary latches on the pluggable transceiver, thereby locking the pluggable transceiver to the cage.

Disengagement of the locking mechanism is obtained by activating a latch release mechanism. Frequently, the latch release mechanism is activated by pulling, in a direction parallel to the cavity. Pulling the latch release mechanism may move a latch slide that has a cammed surface. Movement of the cammed surface imparts lateral motion on the latching tabs, causing them to separate from the latches. As a user pulls on a cable attached to the transceiver, the pluggable transceiver can be withdrawn from the cavity.

With these conventional latching mechanisms, if the pluggable transceiver is pulled out of the cavity before the latch and latching tab are fully separated, the latching tab may become firmly engaged against the latch. This firm engagement may preclude the latch from properly releasing and lead to damage to the cage, particularly if a user who has activated the latch release continues to pull on the cable trying to extract the pluggable transceiver module.

A cage designed for a ganged configuration is particularly susceptible to damage in this way. The latching tabs for adjacent cavities may be punched from the common wall between the cavities. As a result, the latching tabs may be punched one above the other, in a direction perpendicular to the direction of insertion of pluggable transceiver into the cavity. The tabs collectively are centered on the latch slide such that the latch slide on a pluggable transceiver inserted into either cavity engages a portion of the latching tab. In each case the release slide engages the portion of the latching tab that is toward the center of the cavity. The other side of the latch, closest to the top or bottom wall of the cavity, may engage the latch on the pluggable transceiver.

This configuration, in which one side of the latching tab is firmly engaged to the latch of the pluggable transceiver and the other side of the latching tab is being pressed by the release slide, creates a moment on the latching tab, urging it to rotate around the elongated axis of the tab. If the latching tab rotates, instead of being fully pushed back into the wall of the cavity, the latching tab and latch will stay engaged. Unware of the fact that the latch is still engaged with the latching tab, the user may continue to pull the pluggable transceiver, thus mechanically stressing the latching tab. The force of the pulling may in the short term damage the latching tab or in the long run, mechanical stresses imposed by this pulling may limit the lifetime of the latching tabs, and as a result, the lifetime of the cage.

The inventors have recognized and appreciated that the lifetime of a cage may be extended by designing the latching mechanism such that pressure is more uniformly distributed across the latching tabs. Since force is applied more uniformly when a pluggable transceiver is pulled out of a cavity, the risk of faulty disengagements between a latch and a corresponding latching tab is mitigated.

Some embodiments of the present application are directed to latching mechanisms for pluggable transceivers having a pair of spatially offset latches positioned on either sides of the transceiver's housing. Since the latches are spatially offset, the corresponding latching tabs may be positioned in such a way that both sides of the latching tab engage with the transceiver's housing and can both be centered on the release slide of the transceivers with which they engage. That is, a first side of the latching tab abuts a first latching edge of the transceiver's housing while at the same time a second side of the latching tab abuts a second latching edge. In some embodiments, the release slide may engage the latching tab between the first and second sides. In this way, upon activation of the release slide of the pluggable transceiver, pressure may be applied in a substantially balanced fashion across the latching tab such that all latching tabs, upon activation of the release mechanism, are pressed into a wall of the cavity rather than urged to rotate without disengaging from a corresponding latch.

In one example, the latches on opposing sides of a pluggable transceiver may be spaced apart from one another along the longitudinal direction (i.e., the direction of insertion of the pluggable transceiver). That is, one latch extends farther from the back wall of the transceiver's housing than the other latch. Accordingly, corresponding latching tabs positioned on opposite lateral walls of a receiving cage may be offset from another along the longitudinal direction. The longitudinal offset between the latches may be designed to match the longitudinal offset between the latching tabs.

At a common wall of a ganged cage, the latching tabs will be similarly offset along the longitudinal direction. This offset means that the latching tabs may be positioned, in a direction perpendicular to the longitudinal direction, independently of each other. As a result, each latching tab may be centered on its corresponding release slide. Each latching tab may be arranged such that each side abuts a latch edge of the transceiver's housing, with the release slide providing a disengagement force between the points of contact between the latching tab and latch. In this way, rotation of the latching tabs may be prevented.

In another example, the latches and release slides on opposite sides of a pluggable transceiver may be spaced apart from one another along the vertical direction. That is, one latch may extend farther from the housing's bottom wall that the other latch. Corresponding latching tabs may be arranged in a similar relationship. As in the previous example, the offset between the latches and release slides enables two latching tabs in a common wall of a ganged cage to each engage at two sides with a latching edge of the transceiver's housing such that the release slide, when the release mechanism is activated, will press the latching tab into the wall of the cage rather than impart rotational motion that may be inadequate to disengage the latching tab and the latch.

Latching techniques of the type described herein may be used in a variety of settings, including in telecommunications and data communications. For example, latching techniques of the type described herein may be applied to pluggable transceivers designed according to a certain industry standard, such as SFP, QSFP, CFP, or XFP. Of course, latching mechanisms of the type described herein may alternatively be used in connection with non-standardized pluggable transceivers.

Figure 1A:
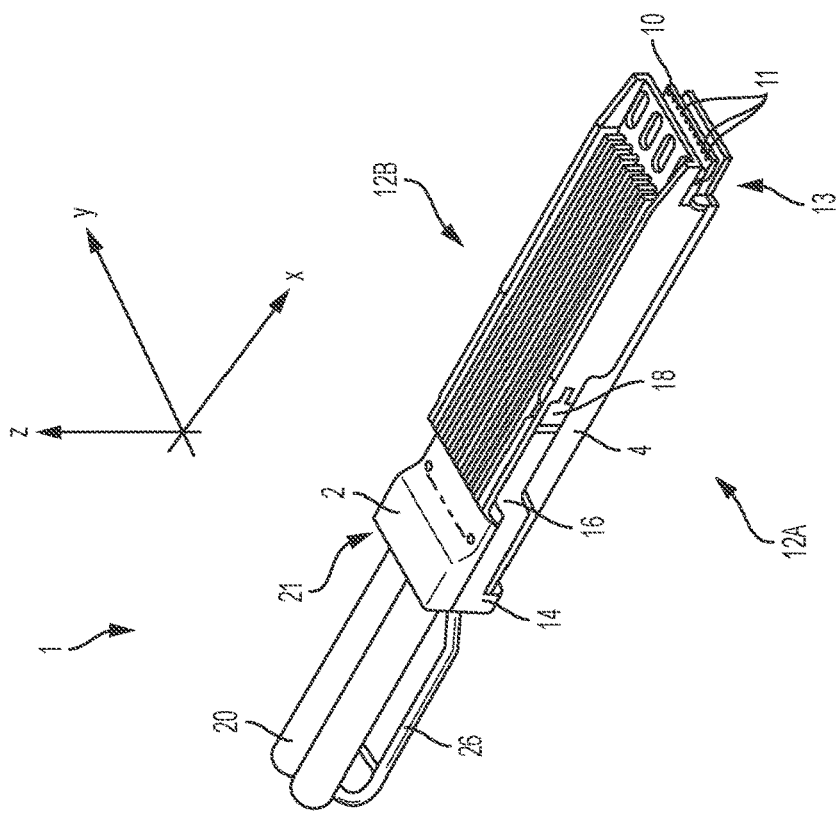
FIG. 1A is an isometric view illustrating a first side of a pluggable transceiver, in accordance with some embodiments.
Figure 1C:
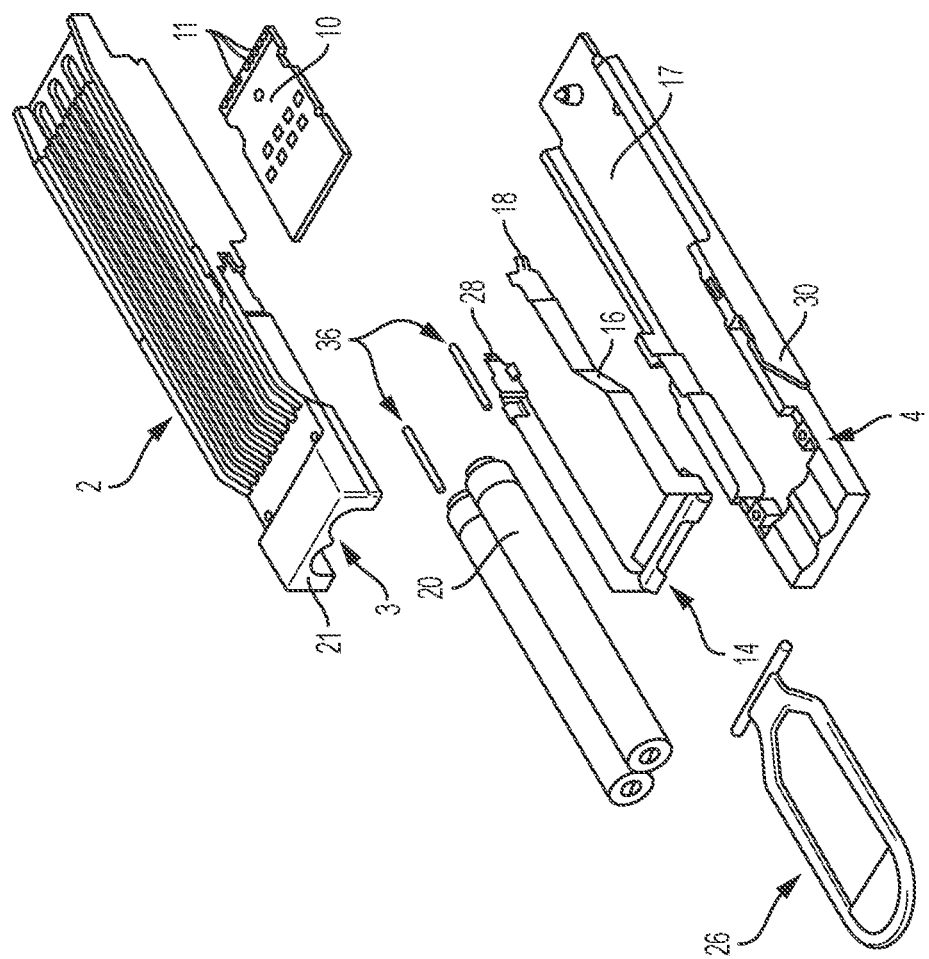
FIG. 1C is an exploded view of the pluggable transceiver of FIG. 1A, in accordance with some embodiments.

FIG. 1A-1B are isometric views illustrating first and second sides, respectively, of a pluggable transceiver. Pluggable transceiver 1 may comprise a housing (which may comprise an upper housing portion 2 and a lower housing portion 4), a paddle card 10, a release slide 14, and a lanyard 26. Pluggable transceiver 1 may be connected to one or more cables 20, which may comprise signal conductors, such as optical fibers and/or electrically conductive wires (e.g., copper wires). As such, paddle card 10 may comprise an optical transceiver and/or an electrical transceiver. The signal conductors may be connected to paddle card 10 and may be passed through an opening 3 formed in the back wall 21 of the housing, which is shown in FIG. 1C.

Paddle card 10 may comprise a circuit board in some embodiments, and, in embodiments in which the transceiver is an active component, one or more electronic and/or optical devices mounted on the circuit board. For example, paddle card 10 may comprise amplifier(s), filter(s), modulator(s), demodulator(s), analog-to-digital converter(s), digital-to-analog converters(s), laser(s), photodetector(s), local oscillator(s), and/or circuitry for carrier recovery. Paddle card 10 may be configured to operate as a transmitter, thus transmitting signals through cable 20, and/or a receiver, thus receiving signals provided via cable 20. Paddle card 10 may comprise a plurality of signal contacts 11 arranged for contacting with a connector disposed on a separate circuit board, such as a motherboard or a daughtercard. The signal contacts 11 may be disposed on the transceiver's circuit board to protrude out of the pluggable transceiver's housing. In one example, the housing may comprise an aperture 13, and paddle card 10 may be positioned such that an edge of the paddle card extends through aperture 13. This edge may be serve as leading edge when the pluggable transceiver is inserted in a corresponding cavity. The aperture and the transceiver may be arranged to provide access to signal contacts 11. Signal contacts 11 may be offset from one another along a direction parallel to the y-axis (also referred to herein as the lateral direction).

Pluggable transceiver 1 may have a mating interface configured to be connected to a connector in a direction parallel to the x-axis, which aligns with the direction of insertion of the pluggable transceiver into a cavity of a cage. The x-axis in the embodiment illustrated is aligned with the longitudinal direction of the transceiver. When connected with a connector, signal contacts 11 are in electrical contact with contact ends disposed in the connector. In some embodiments, the connector is disposed in a cavity formed in a cage, and mating of the pluggable transceiver with the connector is performed by sliding the pluggable transceiver into the cavity along the x-axis.

Figure 2A:
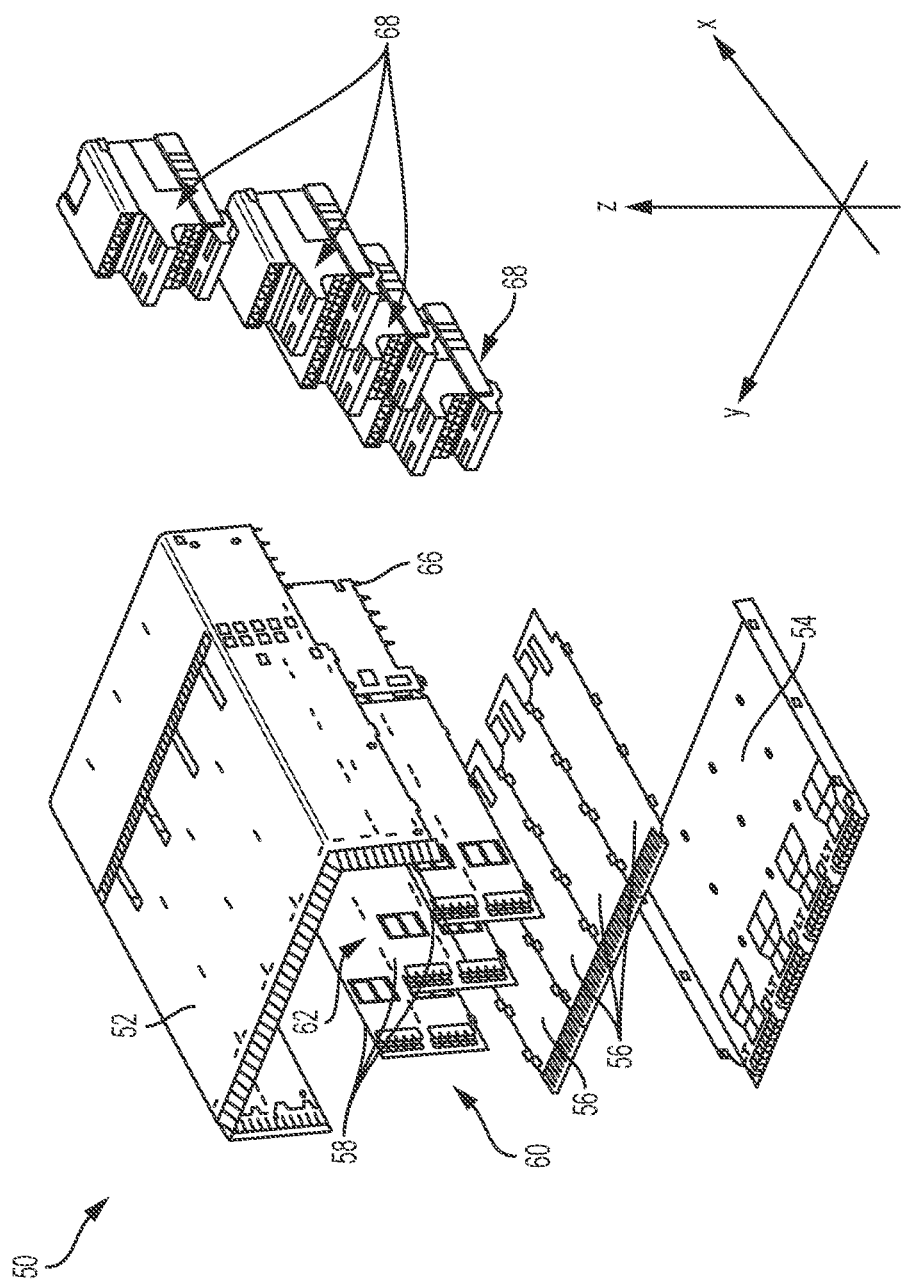
FIG. 2A is an exploded view of a connector and conductive cage configured to receive the pluggable transceiver of FIG. 1A, in accordance with some embodiments.

An example of a cage is illustrated in FIG. 2A. Cage 50 may comprise an upper cage portion 52, a lower cage portion 54, lower wall 56, and lateral walls 58. The cage may be arranged to include one or more cavities, each being configured to receive a pluggable transceiver. In the example of FIG. 2A, two rows of cavities (offset from one another along the z-axis) are formed in the cage. Of course, cages of the types described herein may include any suitable number of rows greater than or equal to one. The cavities 62 may be formed between upper cage portion 52, lower wall 56 and a pair of adjacent lateral walls 58. In some embodiments, mezzanine walls parallel to the lower wall are used to vertically separate rows of cavities. In some of these configurations, pluggable transceivers may be stacked on top of one another. One or more connectors 68 may be disposed in respective cavities 62. A pluggable transceiver 1 may be inserted into a cavity 62 along the longitudinal direction until the signal contacts of the pluggable transceiver contact the contact ends of the connector 68.

The upper cage portions 52 and 54, the lateral wall(s) 58, the bottom wall 56, and, if present, the mezzanine walls, may be made of a conductive material. Lateral walls 58 may form common walls between adjacent cavities. Being conductive, cage 50 may shield paddle card 10, when the pluggable transceiver 1 is mated with connector 68, from electromagnetic interference.

An example of a stacked configuration is depicted in FIG. 2B. As illustrated, a connector 68 may be arranged in a stacked configuration such that a first set of contact ends 69 is disposed within an upper cavity and a second set of contact ends 69 is disposed within a lower cavity of the cage. The plurality of contact ends 69 may be arranged as an array along the y-axis. In some embodiments, connector 68 forms an upper receptacle 65 configured to receive the leading edge of a transceiver's paddle card and a lower receptacle 67 configured to receive the leading edge of another transceiver's paddle card. In this configuration, signal contacts 11 may be arranged as metal pads disposed on a surface (or on two opposite surfaces) of the paddle card and proximate to the leading edge. When a leading edge is received in a receptacle, the metal pads form electrical contacts with the connector's contact ends. Connector 68 may be mounted on and in electrical contact with printed circuit board 80.

A cavity interface 60 is defined at the entrance of cavities 62. The cavity interface 60 may be defined, for example, by a plane perpendicular to the longitudinal direction and passing by the ends of lateral walls 58.

Referring back to FIG. 2A, lateral walls 58 may comprise mounting ends 66 for mounting the cage onto a printed circuit board. In this way, the cage may be connected to a reference potential (e.g., to ground).

To prevent pluggable transceiver 1 from accidently sliding out of a cavity 62, a mechanism for latching the pluggable transceiver to the cage may be provided. In some embodiments, a latching mechanism may comprise a latch formed on the housing of a pluggable transceiver and a latching tab formed on a sidewall 58 of a cage. In some embodiments, a release slide connected to the pluggable transceiver's housing may be used to disengage a latching tab from a corresponding latch.

A representative release slide 14 is illustrated in FIGS. 1A-1B and FIG. 1C. Release slide 14 may be mounted, at least in some embodiments, between upper housing portion 2 and lower housing portion 4. Release slide 14 may be connected to release element 18 (as shown in FIGS. 1A and 1C) and release element 28 (as shown in FIG. 1B and FIG. 1C). Release slide 14 may be arranged such that release element 18 is disposed on a side of the housing (side 12$_A$) and release element 18 is disposed on an opposite side of the housing (side 12$_B$). In some embodiments, release slide 14 is elastically coupled to the housing via one or more compliant members 36 (as shown in FIG. 1C). Compliant member(s) 36 may be implemented using spring(s) in some embodiments.

Figure 1E:
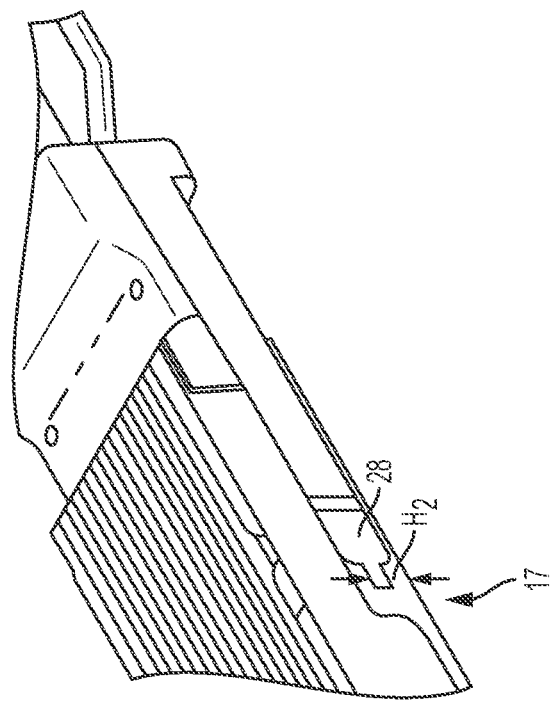
FIG. 1E is an isometric view illustrating a portion of the second side of the pluggable transceiver of FIG. 1A in additional detail, in accordance with some embodiments.
Figure 1D:
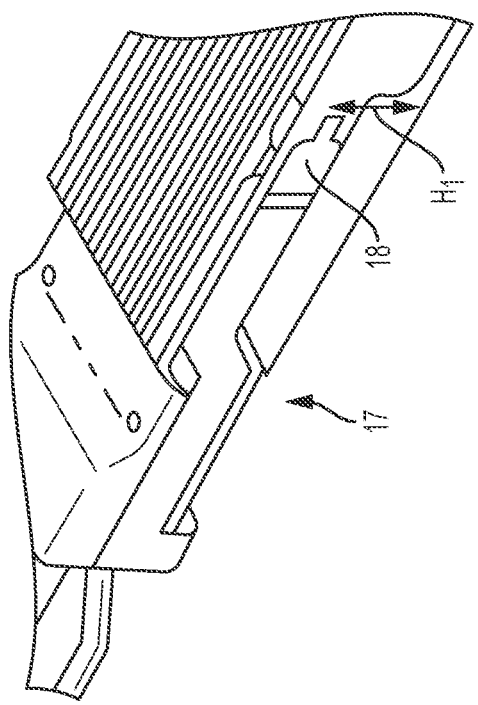
FIG. 1D is an isometric view illustrating a portion of the first side of the pluggable transceiver of FIG. 1A in additional detail, in accordance with some embodiments.

As illustrated in additional detail in FIGS. 1D-1E, release elements 18 and 28 may be spatially offset from each other in a direction parallel to the z-axis. When a connector assembly with a cage in the illustrated embodiment is mounted to a printed circuit board along an edge, the z-axis will form a vertical axis with respect to a "horizon" defined by surface of the printed circuit board and a horizontal axis defined by the edge of the printed circuit board. The distance along the z-axis between the bottom wall 17 and a centerline of a cammed surface on release element 18 is different from the distance between the bottom wall 17 and a centerline of a cammed surface of release element 28. Bottom wall 17 is illustrated in FIG. 1C. In one example, the distance, along the z-axis, between the centerline of a cammed surface of release element 18 and bottom wall 17 is $H_1$ (as shown in FIG. 1D) and the distance, along the z-axis, between the centerline of a cammed surface of release element 28 and bottom wall 17 is $H_2$ (as shown in FIG. 1E), where $H_1$ is greater than $H_2$. Of course, the opposite arrangement is also possible.

In some embodiments, the difference between $H_1$ and $H_2$ may be sufficient to ensure that latching tabs, cut out of a common wall of a cage, exerts balanced forces on corresponding latches on transceivers plugged into cavities on opposing sides of that common wall. In some embodiments, each latching tab may have a width less than or equal to W, and $H_1-H_2$ may be greater than or equal to W. In the embodiment illustrated, each latching tab has the same width, W, and W is less than or equal to one half the width of the sidewall of the transceiver. Moreover, the dimensions $H_1$ and $H_2$ may be such that each latching tab has a central portion aligned with a cammed surface of the release slide such that, upon activation of the release mechanism, the cammed surface imparts a balanced force that presses the release tab towards the common wall rather than imparting a rotational moment. Since the release elements are vertically offset from one another, the latching tabs may be positioned in such a way that both sides of a latching tab engage with the transceiver's housing and can both be centered on the release element of the transceivers with which they engage. In some embodiments, this arrangement allows for a first side of a latching tab to abut a first latch while at the same time a second side of the latching tab abuts a second latch. Allowing the latching tab to engage with two latches may prevent undesired rotations of the latching tab around its elongated axis.

Figure 1F:
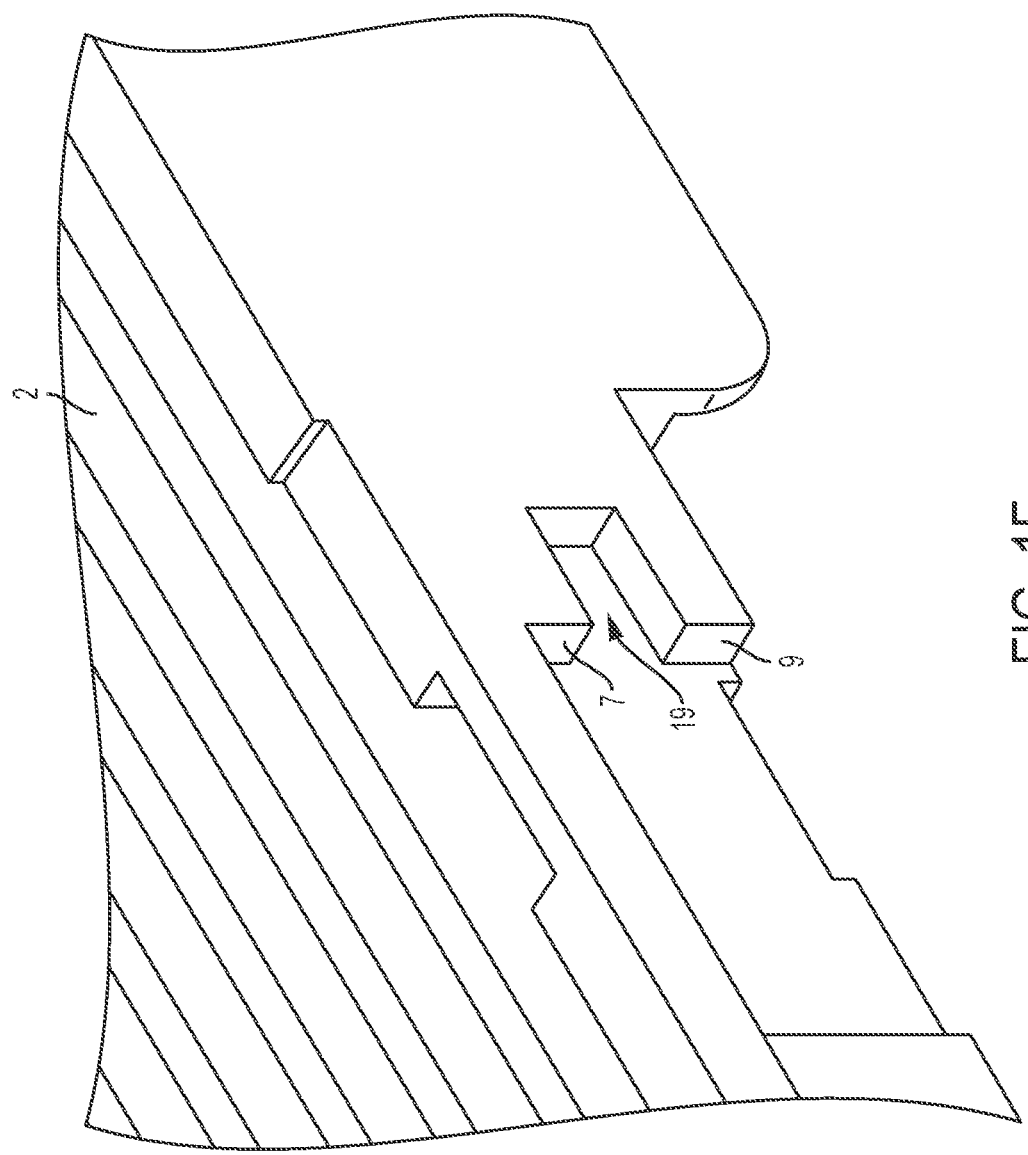
FIG. 1F is an isometric view illustrating a portion of the second side of the pluggable transceiver of FIG. 1A in additional detail, in accordance with some embodiments.

When release slide 14 is mounted to the housing, release element 18 may be positioned to fit, at least partially, in a slot 19 formed in the housing. Slot 19 is illustrated in detail in FIG. 1F. Slot 19 may be formed between latches 7 and 9. Though not illustrated, release element 28 may also be positioned to fit, at least partially, in a slot formed between a pair of latches formed in the housing. In some embodiments, the slot formed on side $12_A$ is formed in the upper portion of the housing and the slot formed on side $12_B$ is formed in the lower portion of the housing. Of course, the opposite arrangement is also possible. In other embodiments, the slots may be formed on the same housing portion even though they are offset from one another along the z-axis.

Release slide 14 may comprise a jog 16 configured to raise (or in some alternative configurations, to lower) the position of release element 18 with respect to release element 28. Jog 16 (shown in FIGS. 1A and 1C) may be positioned between release element 18 and the body of release slide 14 (the portion to which lanyard 26 is connected). Jog 16 may have any suitable shape, including but not limited to an S-shape or a Z-shape. In some embodiments, jog 16 abuts a protrusion formed in the housing. The protrusion may be shaped to conform with the shape of the jog. A representative protrusion 30 is shown in FIG. 1C, and is formed on a side of lower housing portion 4.

Figure 2D:
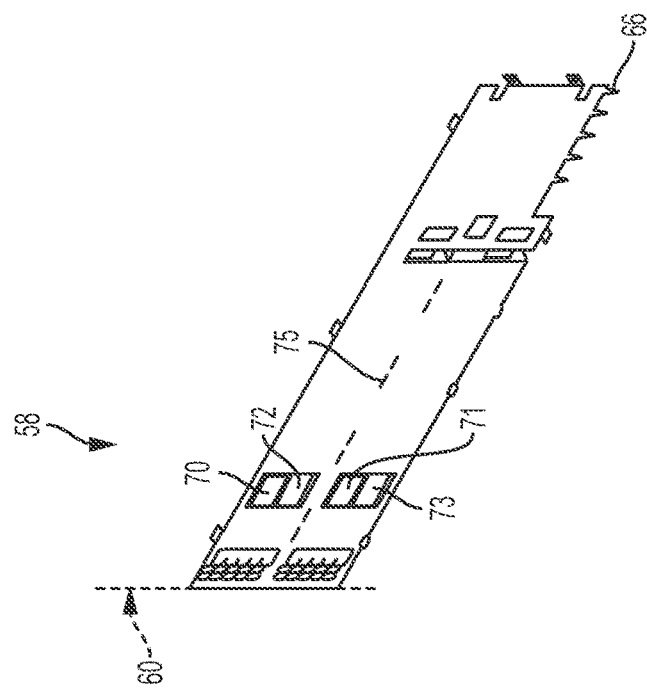
FIGS. 2C-2D illustrate a lateral wall of the conductive cage of FIG. 2A in additional detail, in accordance with some embodiments.
Figure 2C:
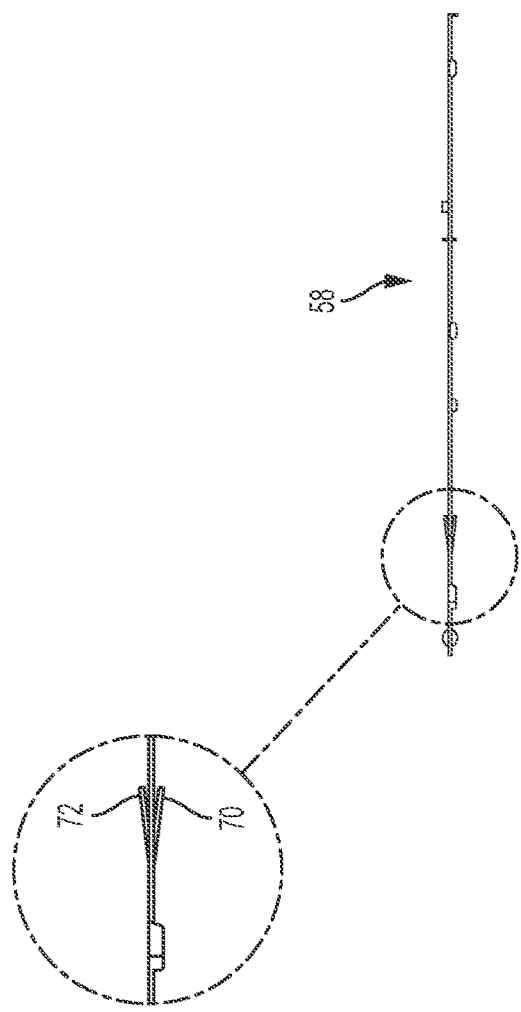

Examples of latching tabs are illustrated in FIGS. 2A and 2C-2D. In these examples, a lateral wall 58 comprises latching tabs 70, 71, 72 and 73. Line 75 defines the plane of a mezzanine wall. The latching tabs may shaped as flaps. As such, they may comprise an end attached to the lateral wall 58 and a free end. The end attached to the lateral wall may be closer, with respect to the free end, to cavity interface 60. The latching tabs may be directed along the longitudinal direction. Naturally, latching tabs 70, 71, 72 and 73 are arranged to hinge about the axis passing by the their points of contact with the lateral wall (upon application of a force).

Latching tabs 70 and 71 may be arranged such that their free ends point towards one cavity (e.g., the cavity to the left of lateral wall 58) and latching tabs 72 and 73 may be arranged such that their free ends point towards the opposite cavity (e.g., the cavity to the right of lateral wall 58). This arrangement is illustrated in detail in FIG. 2C. In some embodiments, latching tabs 70 and 72 are formed in a first opening in the lateral wall and latching tabs 71 and 73 are formed in a second opening in the lateral wall. However, other configurations are also possible. Latching tabs 70 and 72 may be offset from each other, along the z-axis, by an amount substantially equal (e.g., within a fabrication tolerance) to $H_2-H_1$. Latching tabs 71 and 73 may be positioned according to the same relationship.

Figure 3A:
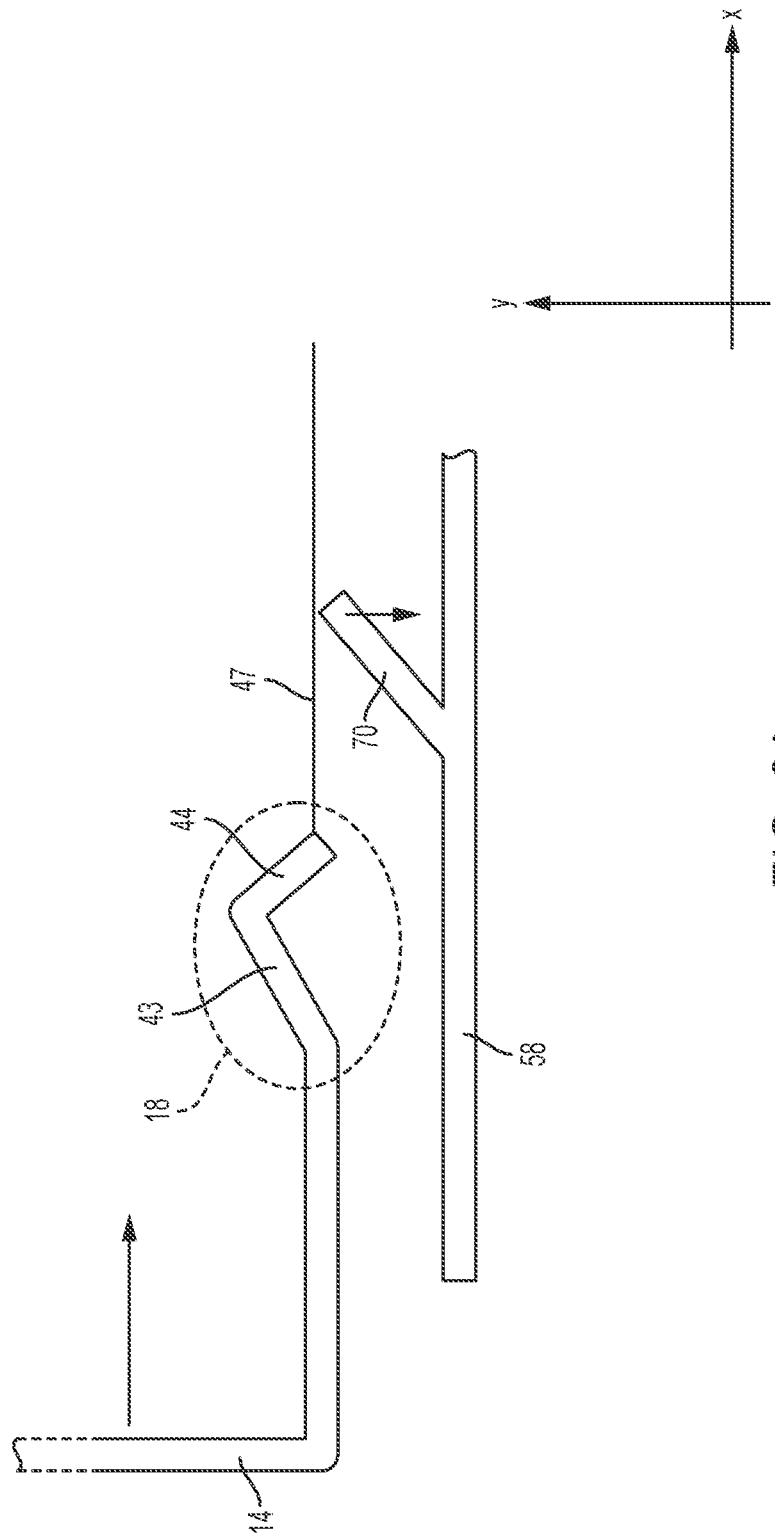
FIGS. 3A-3B are schematic diagrams illustrating a sequence for locking a pluggable transceiver to a conductive cage, in accordance with some embodiments.
Figure 3B:
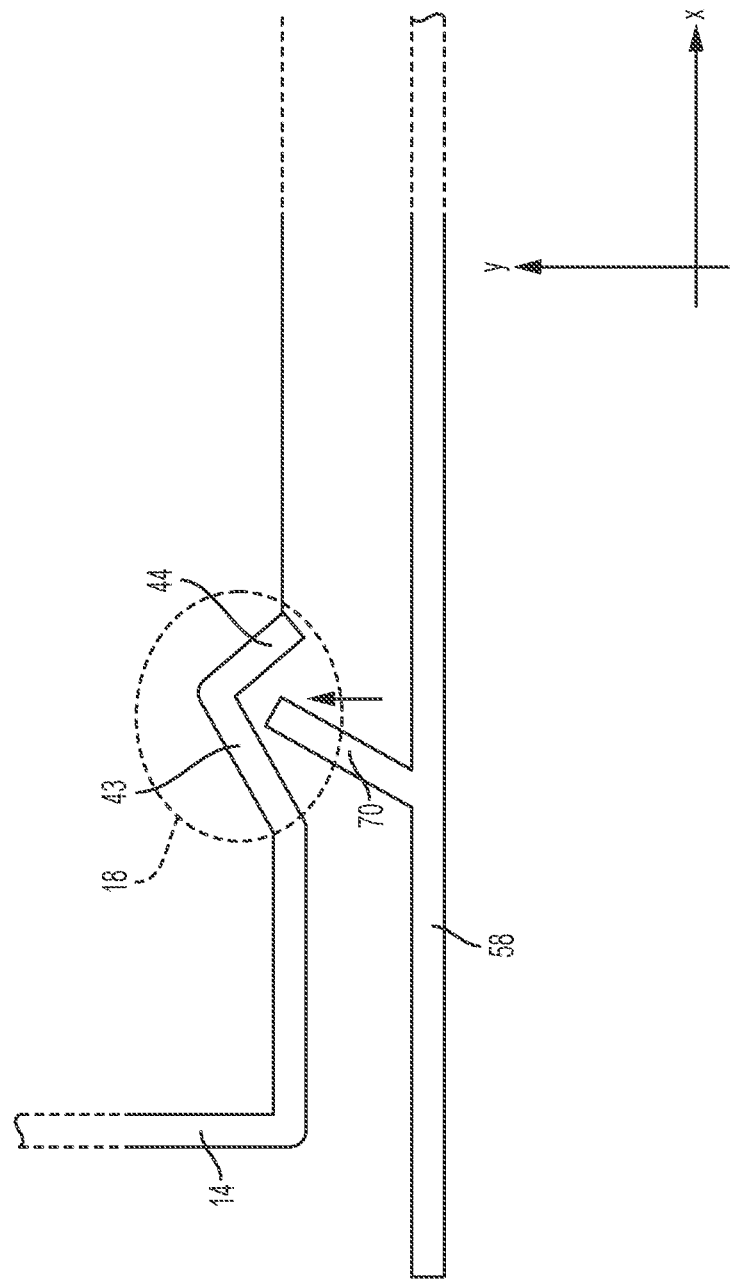
Figure 3C:
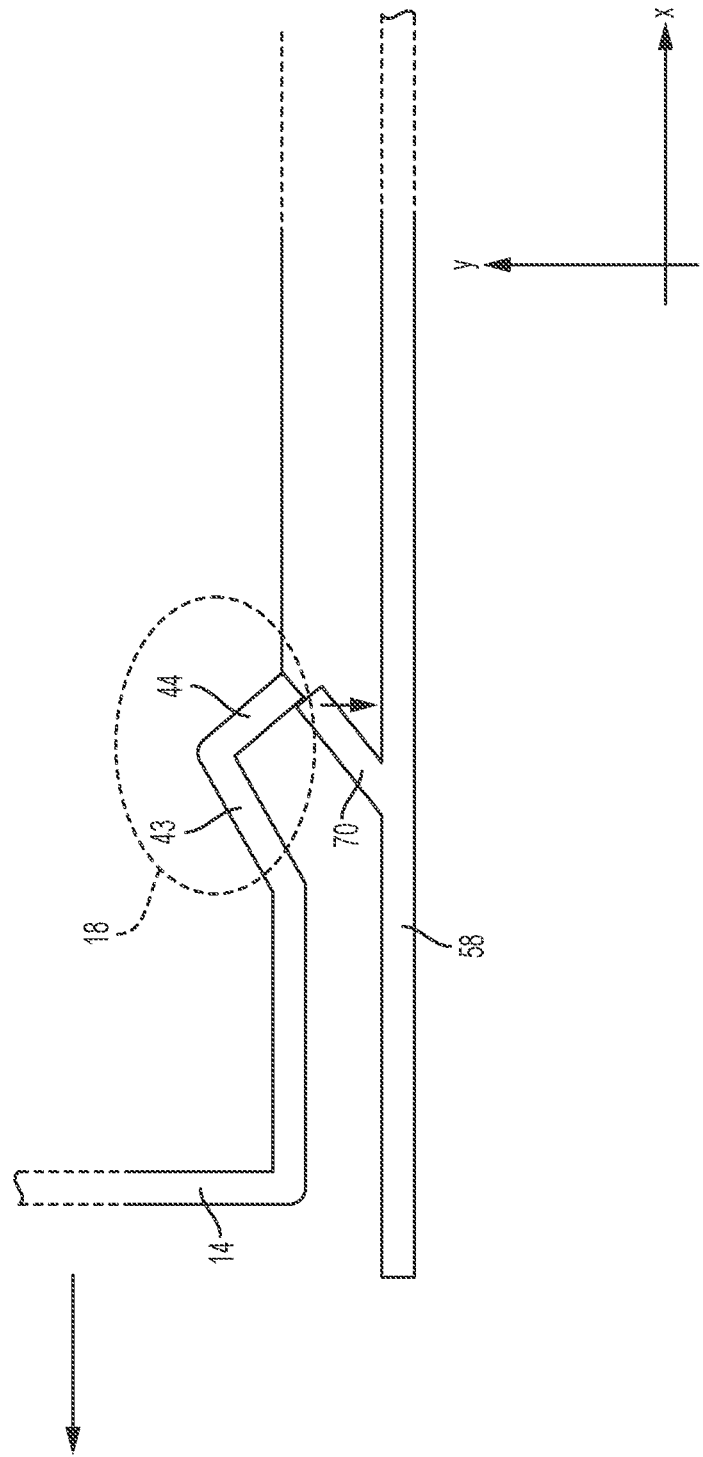
FIG. 3C is a schematic diagram illustrating disengagement of a pluggable transceiver from a conductive cage, in accordance with some embodiments.

An insertion sequence is illustrated in FIGS. 3A-3C, which depict a portion of a pluggable transceiver as it is slid into and out of cavity 62. For the sake of clarity, only a portion of release slide 14 is illustrated in the insertion/extraction sequence. When pluggable transceiver 1 is inserted into a cavity 62, the side wall 47 of the transceiver's housing may slide against the latching tab 70 thus causing the latching tab to flex out of the way (FIG. 3A). Consequently, a free passage for insertion of the pluggable transceiver is created. As the pluggable transceiver proceeds further into the cavity, the distance between the latching tab 70 and the corresponding latches 7 and 9 (not shown in FIGS. 3A-3C) is reduced. When the latches 7 and 9 reach the locations of the latching tab, the latches and the latching tab engage with each other.

The latched configurations is illustrated in FIG. 3B and FIG. 4. As illustrated in FIG. 3B, latching tab 70 may flex closer to the center of the cavity relative to the position shown in FIG. 3A. In some embodiments, motion of the latching tab toward the center of the cavity may be enabled by the presence of cammed surface 43, which may form a depression in the pluggable transceiver's housing. In some embodiments, the depression is arranged to receive the end of latching tab 70 therein (FIG. 3B).

As illustrated in FIG. 4, latching tab 70 may engage latches 7 and 9. Latches 7 and 9 may be configured to engage opposite sides of the latching tab's distal edge. In this configuration, since the latching tab contacts two latches, when the pluggable transceiver is pulled away from the cavity, force is exercised on two sides of the latching tab's free end. As a result, moments leading to rotations of the latching tab around its elongated axis may be prevented.

In some embodiments, the release elements may comprise cammed surfaces for facilitating release of the latching tab from the corresponding latches. For example, release element 18 may comprise cammed surface 44. In some of the embodiments in which release element 18 comprises a cammed surface 43, cammed surface 44 may be connected to cammed surface 43. cammed surface 44 may extend toward the lateral wall 58 and away from the center of the cavity. Cammed surface 44 is illustrated in FIG. 4 in the latched configuration. While the embodiments illustrated include release elements including a pair of cammed surfaces, not all embodiments are limited in this respect as other configurations are also possible.

As illustrated in FIG. 3C, when the release slide 14 is pulled out of the cavity, cammed surface 44 may slide against the latching tab's end thus causing the latching tab to flex toward the lateral wall 58. In this way, the latching tab is disengaged from the latches 7 and 9, and the pluggable transceiver is free to be removed from the cavity.

In some embodiments, cammed surface 44 abuts against a portion 77 (shown in FIG. 4) of the latching tab's end that is between the points of contact with corresponding latches. As a result, force is exercised on or near the latching tab's centerline and is thus uniformly distributed along the latching tab's free end when the pluggable transceiver is pulled out of the cavity.

In some embodiments, release slides may be configured such that the release elements, the latches, and correspondingly the latching tabs, are offset along the longitudinal direction. As in the configuration described above, the spatial separation between the latching tabs may allow for each latching tab of either side of a common lateral wall to contact more than one latch of a corresponding pluggable transceiver, in the latched configuration. As a result, rotation of the latching tab around its elongated axis may be prevented. One such arrangement is illustrated in FIGS. 5A-5D.

Pluggable transceiver 101 may comprise housing upper housing portion 2, lower housing portion 4, a paddle card 10, lanyard 26 and release slide 114. Release slide 114 may include release elements 118 and 128. release elements 118 and 128 may be spatially offset from each other in a direction parallel to the x-axis. That is, the distance along the x-axis between the housing's back wall 21 and release element 118 is different from the distance between the back wall 21 and release element 128. In the example illustrated in FIGS. 5A-5B, the distance, along the x-axis, between release element 118 and back wall 21 is $D_1$ and the distance, along the x-axis, between release element 128 and back wall 21 is $D_2$, where $D_1$ is greater than $D_2$. Of course, the opposite arrangement is also possible. In some embodiments, the difference between $D_1$ and $D_2$ may be greater than the length of the corresponding latching tabs. In this way, the position in the z-direction of the latching tabs in a common wall of the cage may be set independently, allowing both to be centered on the latching elements of the transceiver such that forces are balanced. Therefore, pulling the release slide may deflect the latching tabs into the common lateral wall, rather than imparting rotational motion that may prevent the transceiver from being released.

Figure 5C:
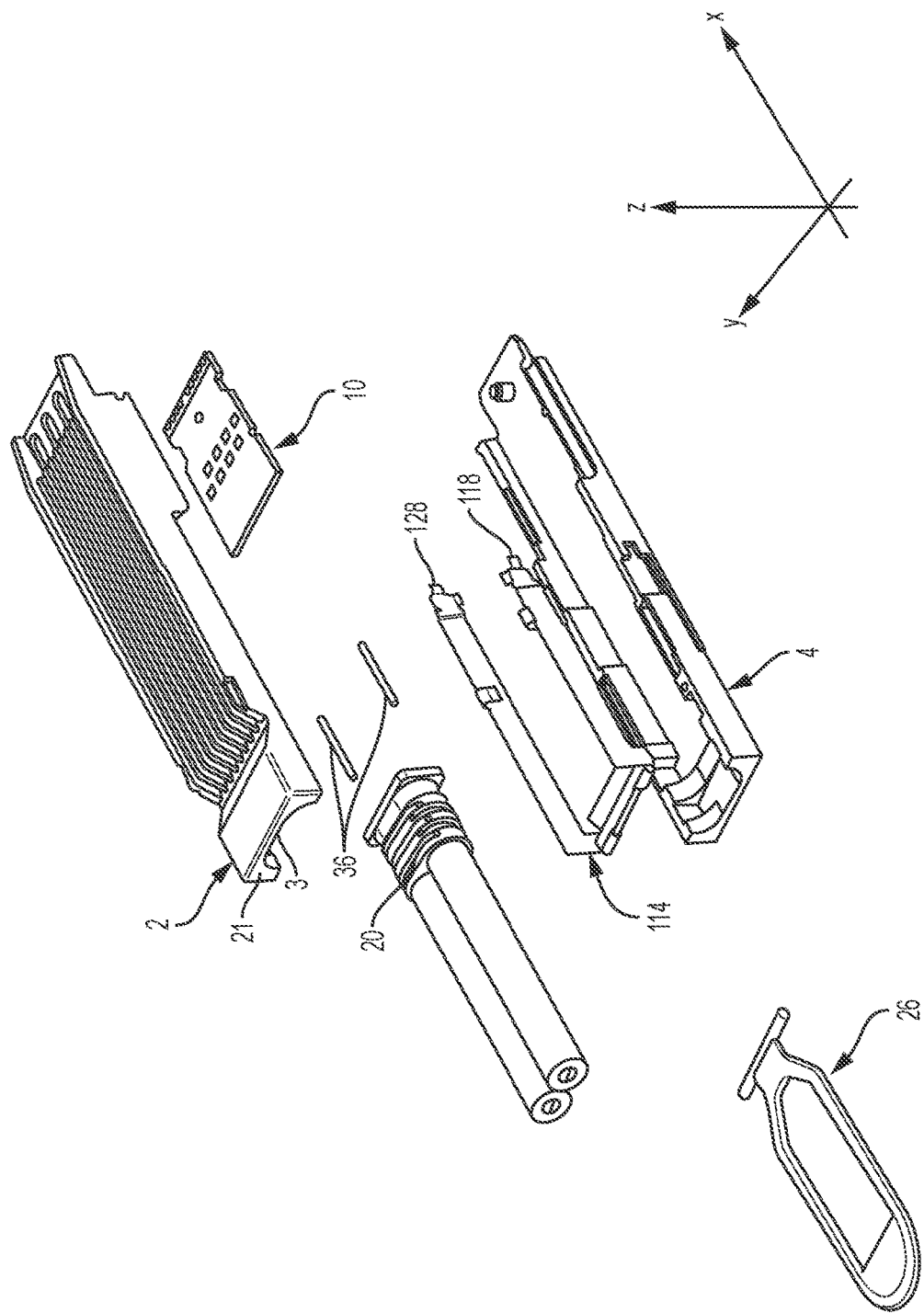
FIG. 5C is an exploded view of the pluggable transceiver of FIG. 5A, in accordance with some embodiments.
Figure 5D:
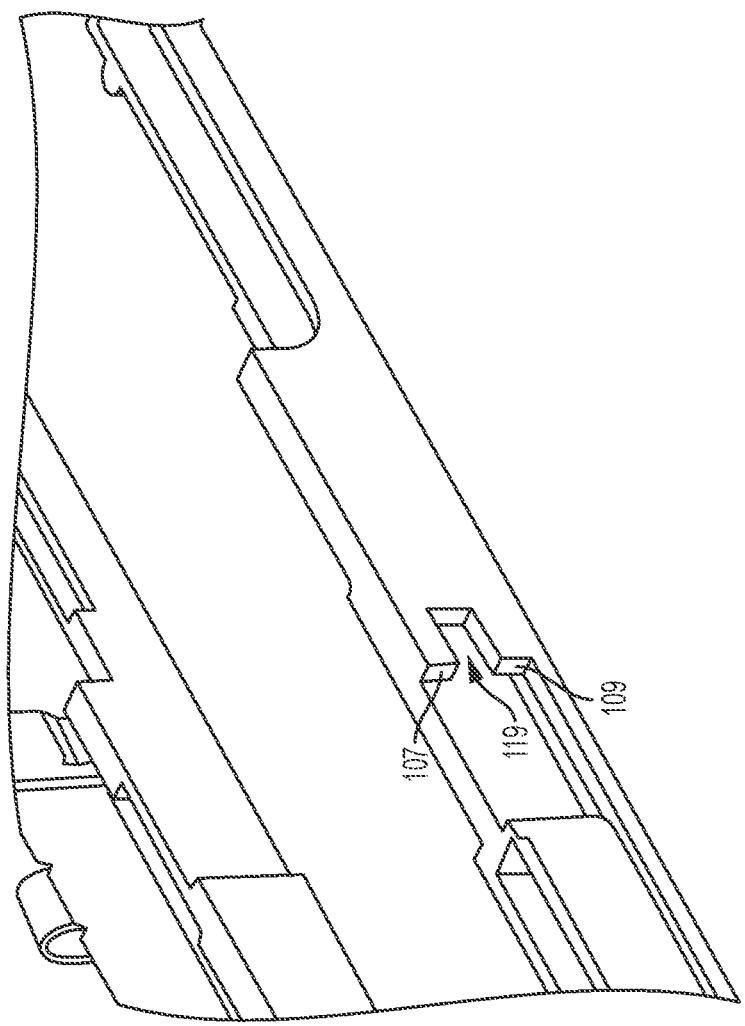
FIG. 5D is an isometric view illustrating a portion of the first side of the pluggable transceiver of FIG. 5A in additional detail, and with a latching member removed, in accordance with some embodiments.

When release slide 114 is mounted to the transceiver's housing, release element 118 may fit, at least partially, in the slot 119 (shown in FIG. 5D). Slot 119 may be formed in the transceiver's housing (e.g., lower housing portion 4) such that a pair of latches 107 and 109 are formed. These latches may be offset from one another along the z-axis.

Figure 6B:
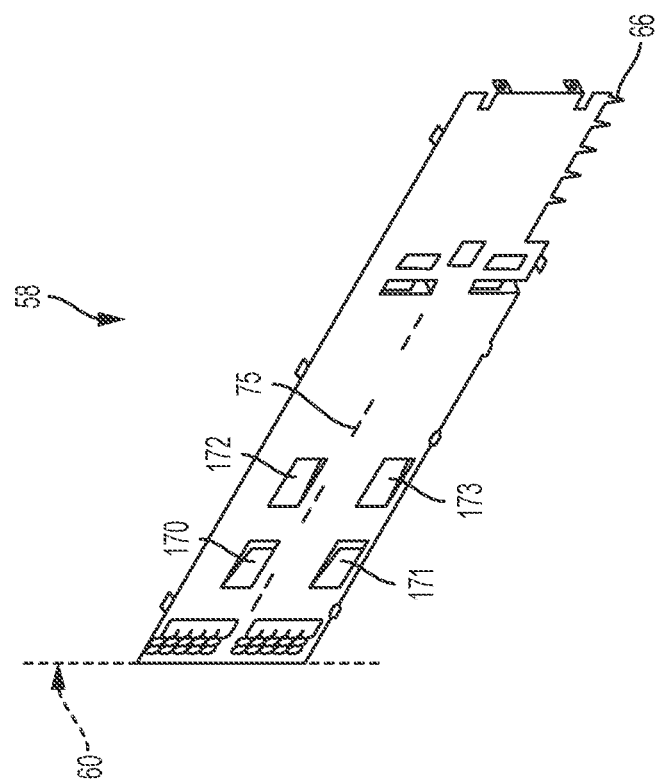
FIGS. 6A-6B illustrate a lateral wall of another conductive cage, in accordance with some embodiments.
Figure 6A:
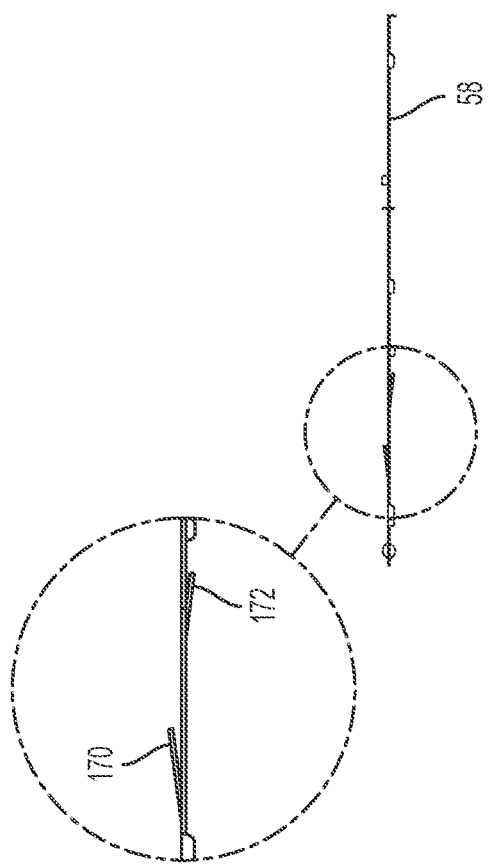

Pluggable transceiver 101 may be configured to be inserted in a conductive cage 50 with lateral walls 58 having longitudinally offset latching tabs. An example of such a lateral wall is illustrated in FIGS. 6A-6B. In this case, lateral wall 58 comprises latching tabs 170, 171, 172, and 173. Latching tabs 170 and 172 may be spaced apart from one another by a distance equal to $D_2$-$D_1$. The same arrangement may be applied to latching tabs 171 and 173. Latching tab 172 may be configured to lock to latches 107 and 109 of a pluggable transceiver 101 such that both sides of the latching tab abut a latch. Latching tab 170 may be configured to lock to another pair of latches disposed on another pluggable transceiver 101 being inserted on the opposite side of lateral wall 58. As in the case described in connection with FIGS. 3A-3C, release elements 118 and 128 may comprise, at least in some embodiments, cammed surfaces 43 and 44. Cammed surface 43 may be arranged to provide sufficient room for the latching tab to flex toward the center of the cavity in the latched configuration. Cammed surface 44 may be arranged to slide against the latching tab when the release slide is pulled, thus disengaging the latching tab from the latches.

Figure 7:
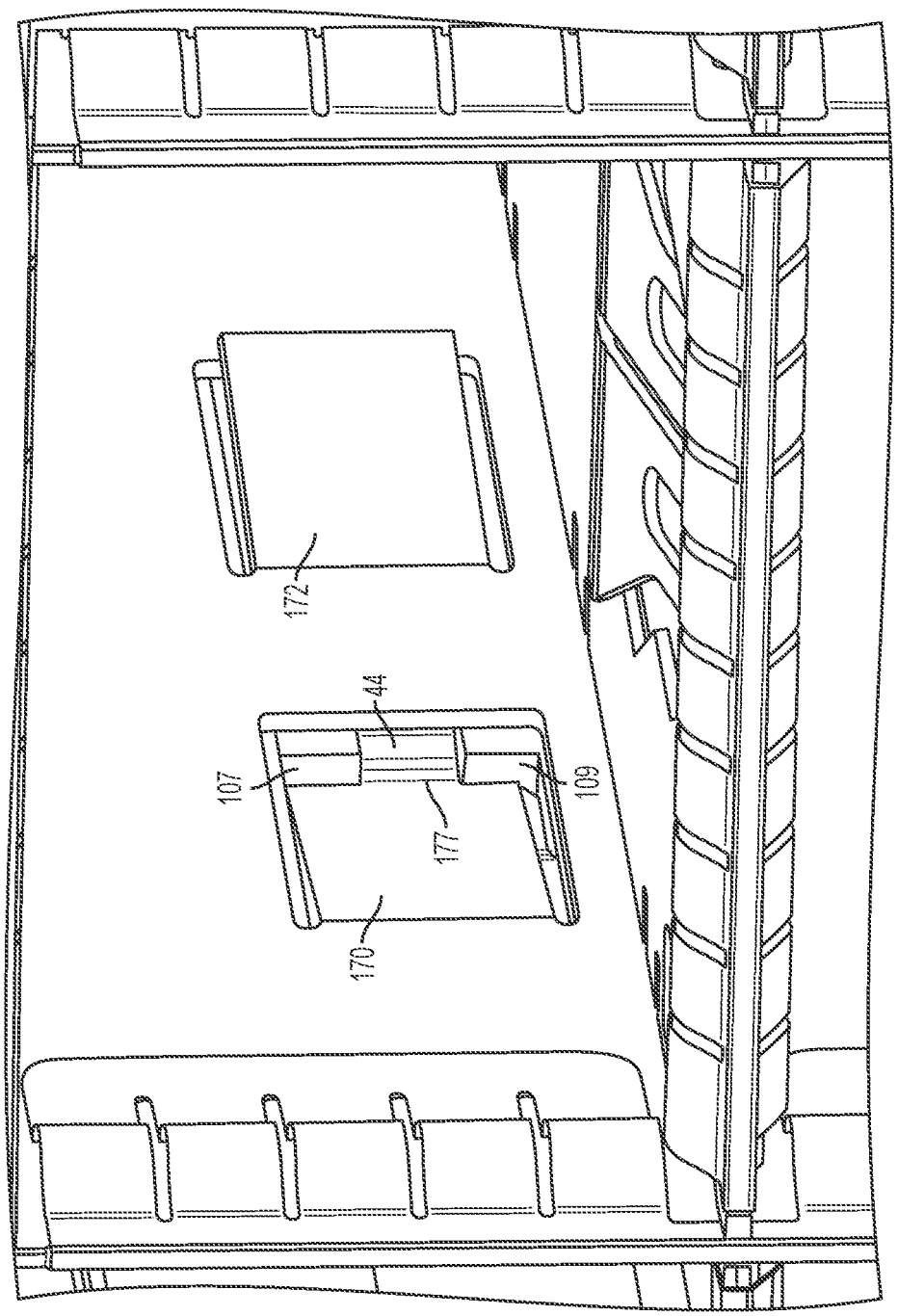
FIG. 7 is an isometric view illustrating latching tabs for adjacent cavities, in accordance with some embodiments.

As illustrated in FIG. 7, when the release slide is actuated, force is exercised by the cammed surface of the release element on a portion 177 of the latching tab 170 that is between the points of contact with latches 107 and 109. As a result, a balanced force is imparted on the latching tab, which is pressed towards the common wall, rather than being imparted a rotational moment.

In some embodiments, latches, and correspondingly latching tabs, may be arranged to be vertically offset (as illustrated in FIG. 1C) and longitudinally offset (as illustrated in FIG. 5C).

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in non-transitory computer-readable storage media in any suitable form. For simplicity of illustration, data structures may be shown to have fields that are related through location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A pluggable transceiver configured to be mated to a connector along a first direction, the pluggable transceiver comprising:
   a housing comprising a back wall having an opening for receiving a cable therein and a bottom wall;
   a transceiver disposed within the housing, the transceiver comprising a plurality of signal contacts spaced from one another along a second direction; and
   a release slide connected to the housing and comprising first and second release elements, the first and second release elements being spatially offset from one another along the first direction and/or along a third direction perpendicular to the first and second directions.

2. The pluggable transceiver of claim 1, wherein the first release element is positioned at a first distance, along the first direction, from the back wall, and
   the second release element is positioned at a second distance, along the first direction, from the back wall, the second distance being different from the first distance.

3. The pluggable transceiver of claim 1, wherein the first release element is positioned at a first distance, along the third direction, from the bottom wall, and
   the second release element is positioned at a second distance, along the third direction, from the bottom wall, the second distance being different from the first distance.

4. The pluggable transceiver of claim 3, wherein the first release element is connected to the release slide through a jog.

5. The pluggable transceiver of claim 4, wherein the jog abuts a protrusion formed in the housing.

6. The pluggable transceiver of claim 1, wherein the release slide is configured to slide with respect to the housing when pulled away from the housing.

7. The pluggable transceiver of claim 1, further comprising a lanyard coupled to the release slide.

8. The pluggable transceiver of claim 1, further comprising a compliant member coupled between the housing and the release slide.

9. The pluggable transceiver of claim 1, wherein the transceiver comprises a paddle card, the paddle card having an edge that protrudes from an aperture formed in the housing.

10. The pluggable transceiver of claim 1, wherein the transceiver comprises an optical device.

11. The pluggable transceiver of claim 1, wherein each of the first and second release elements comprises a cammed surface forming a depression in the housing.

12. The pluggable transceiver of claim 11, wherein the cammed surface is a first cammed surface, and wherein each of the first and second release elements comprises a second cammed surface connected to a respective first cammed surface, the second cammed surface pointing away from the housing.

13. The pluggable transceiver of claim 1, wherein the first release element fits, at least partially, within a slot formed between a pair of latches.

14. The pluggable transceiver of claim 1, wherein the first direction matches with a longitudinal axis of the transceiver, and wherein the plurality of signal contacts and the back wall are at opposite ends of the pluggable transceiver along the longitudinal axis.

15. A pluggable transceiver configured to be mated to a connector along a first direction, the pluggable transceiver comprising:
   a housing comprising a back wall having an opening for receiving a cable therein, and a bottom wall;
   a paddle card disposed within the housing, the paddle card comprising a plurality of signal contacts spaced from one another along a second direction; and
   a release slide elastically coupled to the housing and having first and second arms, the first arm extending farther than the second arm along the first direction.

16. The pluggable transceiver of claim 15, further comprising an optical transceiver mounted on the paddle card.

17. The pluggable transceiver of claim 15, wherein the release slide is configured to slide with respect to the housing when pulled away from the housing.

18. The pluggable transceiver of claim 15, further comprising a lanyard coupled to the release slide.

19. The pluggable transceiver of claim 15, wherein the first direction matches with a longitudinal axis of the pluggable transceiver, and wherein the plurality of signal contacts and the back wall are at opposite ends of the pluggable transceiver along the longitudinal axis.

20. A pluggable transceiver configured to be mated to a connector along a first direction, the pluggable transceiver comprising:
- a housing comprising a back wall having an opening for receiving a cable therein, and a bottom wall;
- a paddle card disposed within the housing, the paddle card comprising a plurality of signal contacts spaced from one another along a second direction; and
- a release slide elastically coupled to the housing and comprising first and second arms having respective ends that are offset relative to each other along a third direction perpendicular to the first and second directions.

21. The pluggable transceiver of claim 20, wherein the end of the first arm is positioned at a first distance, along the third direction, from the bottom wall, and
- the end of the second arm is positioned at a second distance, along the third direction, from the bottom wall, the second distance being different from the first distance.

22. The pluggable transceiver of claim 21, wherein the first arm comprises a jog.

23. The pluggable transceiver of claim 22, wherein the jog curves in the third direction.

24. The pluggable transceiver of claim 20, wherein the release slide is configured to slide with respect to the housing when pulled away from the housing.

25. The pluggable transceiver of claim 20, further comprising a lanyard coupled to the release slide.

* * * * *